(12) United States Patent
Shim et al.

(10) Patent No.: US 7,186,649 B2
(45) Date of Patent: Mar. 6, 2007

(54) SUBMICRON SEMICONDUCTOR DEVICE AND A FABRICATING METHOD THEREOF

(75) Inventors: Joon Bum Shim, Gyeonggi-do (KR); Han Gyoo Hwang, Seoul (KR); Kang-Hyun Lee, Gyeonggi-do (KR)

(73) Assignee: Dongbu Electronics Co. Ltd., Seoul (KR)

( * ) Notice: Subject to any disclaimer, the term of this patent is extended or adjusted under 35 U.S.C. 154(b) by 0 days.

(21) Appl. No.: 10/747,946

(22) Filed: Dec. 31, 2003

(65) Prior Publication Data

US 2004/0203236 A1    Oct. 14, 2004

(30) Foreign Application Priority Data

Apr. 8, 2003   (KR) ................. 10-2003-0022107
Jul. 12, 2003   (KR) ................. 10-2003-0047491

(51) Int. Cl.
*H01L 21/302*    (2006.01)

(52) U.S. Cl. ............... 438/689; 438/745; 438/753; 438/756; 438/947; 438/717; 438/719; 438/723

(58) Field of Classification Search ............ 438/689, 438/299–308, 584–596, 745, 756, 947, 753, 438/717, 719, 723
See application file for complete search history.

(56) References Cited

U.S. PATENT DOCUMENTS 5,332,445 A * 7/1994 Bergman .................. 134/3
6,030,541 A   2/2000 Adkisson et al.
6,251,719 B1  6/2001 Wang
6,420,097 B1 * 7/2002 Pike et al. .................. 430/313
6,482,726 B1 * 11/2002 Aminpur et al. ............ 438/585
6,878,646 B1 * 4/2005 Tsai et al. .................. 438/756
2003/0211684 A1 * 11/2003 Guo ........................ 438/230
2004/0038436 A1 * 2/2004 Mori et al. .................. 438/17
2004/0121593 A1 * 6/2004 Matsunuma ................. 438/671

OTHER PUBLICATIONS

Wolf, Stanley "silicon processing for the VLSI ERA" 1986, vol. 2, pp. 194.*
Wolf, Stanley "silicon processing for the VLSI ERA" 1986, vol. 2, pp. 542-551.*

* cited by examiner

*Primary Examiner*—Nguyen Thanh
(74) *Attorney, Agent, or Firm*—Pillsbury Winthrop Shaw Pittman LLP

(57) ABSTRACT

A method of forming a pattern finer than an existing pattern in a semiconductor device using an existing light source and a hard mask, and a method of removing the hard mask which is used as an etching mask. The method includes forming an oxide layer on a substrate; forming a polysilicon layer on the oxide layer; forming a hard mask on the polysilicon layer; depositing photoresist on the hard mask and patterning the hard mask by using the photoresist; and etching the polysilicon layer using the pattern embodied by the hard mask. By fabricating a gate oxide with a finer linewidth using a hard mask and existing equipment, the present invention can control the linewidth required in each product by using an etching process, and, therefore, has advantages such as expandability of process, extension of generality, and maximization of productivity in the production line.

5 Claims, 2 Drawing Sheets

SUBMICRON SEMICONDUCTOR DEVICE AND A FABRICATING METHOD THEREOF

CROSS REFERENCE TO RELATED APPLICATIONS

This application claims priority to Korean application No. 10-2003-0022107, filed Apr. 8, 2003 and Korean application No. 10-2003-0047491, filed Jul. 12, 2004, the contents of which are incorporated herein in its entirety by reference.

BACKGROUND

1. Field of the Invention

The present invention relates to a method of fabricating a semiconductor device using a hard mask and, more particularly, to a method of forming a pattern finer than an existing pattern in a semiconductor device using an existing light source and a hard mask, and a method of removing the hard mask which is used as an etching mask.

2. Related Art

A photolithography process has been widely used as a technology for forming a fine pattern required for achieving high-integration semiconductor devices. In general, lithography is a patterning process divided into a photo process and an engraving process. However, in recent years, lithography has come to mean only the photo process. In particular, photolithography includes optical and non-optical photolithography based on the light source. In a semiconductor process, photolithography is a technology to form a circuit on a substrate, comprising the processes of coating photoresist on a substrate, transmitting light through a mask so that the photoresist reacts with the light, developing the photoresist to form a pattern, and embodying the desired pattern by engraving the substrate with the photoresist pattern.

Increased integration of semiconductor chips has occurred by a factor of about 4 times every 3 years. In the photolithography process, there have been many developments in materials, such as chemically amplified resist (CAR), in processing aspects such as tri-layer resist (TLR), bi-layer resist (BLR), top surface imaging (TSI), anti-reflective coating (ARC), etc., and in mask aspects such as a phase shift mask (PSM), optical proximity correction (OPC), etc., as well as in the exposure equipment itself, such as a lens having high numerical aperture and hardware.

Early exposure equipment included a contact printer that employed an exposing scheme, where a mask was located on an upper portion of a substrate to be close to the substrate, and an operator adjusted the focus of the optical system using the operator's eyes. Then, as this technology developed, the resolution was enhanced by reducing the gap between the mask and the substrate, and exposure was achieved through soft contact or hard contact (lower than 10 µm), according to the gap size.

In the early 1970s, a projection-type exposure equipment, which employed an optical scheme using reflection or refraction, was developed. Accordingly, advancements such as improvement of resolution and an increase in the life of a mask as well as wafer size scale-up, were actively applied to product developments. Then, in the mid-1970s, a stepper applying projection optics was developed to substantially contribute to mass production of semiconductors. The stepper, adopting an exposure scheme of "step and repetition," made a turning point in the development of photolithography. By using exposure equipment adopting the stepper method, accuracy in setting as well as resolution was enhanced. The early stepper adopted a reducing projection exposure method having a mask to be patterned on a substrate using a reduction ratio of about 5 to 1 or about 10 to 1. However, the ratio of about 5 to 1 became gradually in common use due to limitations in mask pattern and size.

In early 1990s, a scanner adopting an exposure scheme of "step and scanning" was developed. The scanner type exposure equipment was able to cope with increasing chip size and raise productivity, although it put a heavy burden on a mask pattern by using a 4 to 1 reduction method.

The resolution of photolithography is closely related to a wavelength of an exposure source. Early exposure equipment using a wavelength of 436 nm(g-line) was able to form a pattern of about 0.5 µm, and an exposure using a wavelength of 365 nm(i-line) was able to form a pattern of about 0.3 µm.

Recently, exposure equipment using KrF lasers having a wavelength of 248 nm as a light source, new photoresist materials and other incidental technologies, have made it possible to form a pattern having a design rule lower than 150 nm. Now, developing technology is capable of forming a fine pattern less than 110 nm by using exposure equipment employing an ArF laser with a wavelength of 193 nm.

Deep ultra-violet (hereinafter referred to as "DUV") photolithography has high resolution and a good depth of focus (hereinafter referred to as "DOF") property compared to the i-line, but it is difficult to control. This process control problem can result optically due to a short wavelength and chemically due to using a chemically amplified photoresist. As the wavelength becomes shorter, a critical dimension (hereinafter referred to as "DC") tilting phenomenon becomes more severe, due to a static wave effect and an engraving phenomenon of reflective light.

A method to solve limitations of a photolithography process is to adjust bias, i.e., difference between values of critical dimension of the photoresist pattern before and after etching. However, although this method is used, it is not easy to cope with a margin of linewidth that is being reduced.

A hard mask may be formed on an etch-target layer, and a photoresist pattern is formed on the hard mask. The photoresist pattern is formed more thinly than the photoresist pattern so as to form the hard mask pattern having the same size as the photoresist pattern through an etching process using the photoresist pattern Then, the etch-target layer is etched using the hard mask pattern as a mask to form the etch-target layer pattern having a desired size.

Subsequently, the hard mask is removed by means of a dry-etching process. However, in a conventional art, the hard mask on a substrate is not removed completely due to difference of process uniformity between a dry-etching process and a film deposition process. Such residual hard mask obstructs reaction between polysilicon and titanium or cobalt during a silicide formation process, and, therefore, the silicide to reduce contact resistance may not be formed properly. Accordingly, device reliability is deteriorated because the contact resistance increases due to an absence of silicide.

U.S. Pat. No. 6,030,541 discloses a method of fabricating a semiconductor device using a hard mask as an etching mask. And, U.S. Pat. No. 6,251,719 discloses a method of removing a hard mask. However, there is not disclosed a method of fabricating a submicron semiconductor having a pattern finer than that embodied by using these disclosed methods.

SUMMARY OF THE INVENTION

A method of fabricating a submicron semiconductor device, includes forming an oxide layer on a substrate, forming a polysilicon layer on the oxide layer, forming a hard mask on the polysilicon layer, depositing photoresist on the hard mask and patterning the hard mask by using the photoresist, and etching the polysilicon layer using the pattern embodied on the hard mask.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of the embodiments and are incorporated in and constitute a part of this application, and illustrate embodiments of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
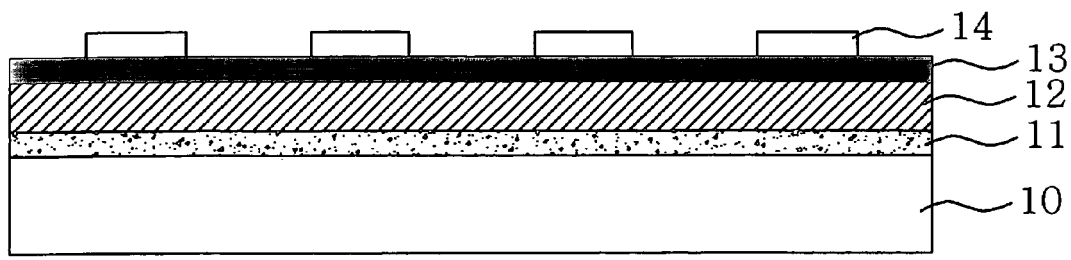
FIG. 1 is a cross-sectional view of a patterned semiconductor device.

Referring to FIG. 1, an oxide layer 11, a polysilicon layer 12, a hard mask 13, and a photoresist 14 are deposited on a substrate 10. Then, the photoresist 14 is patterned using a mask. In detail, a thermal oxide layer 11 as a gate oxide is grown on the substrate 10 where an active area is defined, and, then, the polysilicon layer 12 is grown on the thermal oxide layer 11. The hard mask 13 for patterning a gate is deposited on the polysilicon layer 12, and photolithography is performed using the photoresist 14. In patterning the photoresist 14 using a KrF laser as a light source, the width of the pattern can be about 120 nm. The hard mask 13, can be between 150 Å and 400 Å in thickness, can be $SiH_4$ oxide, and formed by means of plasma enhanced chemical vapor deposition (hereinafter referred to as "PE-CVD"). In addition, anti-reflection coating (hereinafter referred to as "ARC") may be deposited on the hard mask 13 so as to lower reflectivity. The ARC is of organic or inorganic material.

Figure 2:
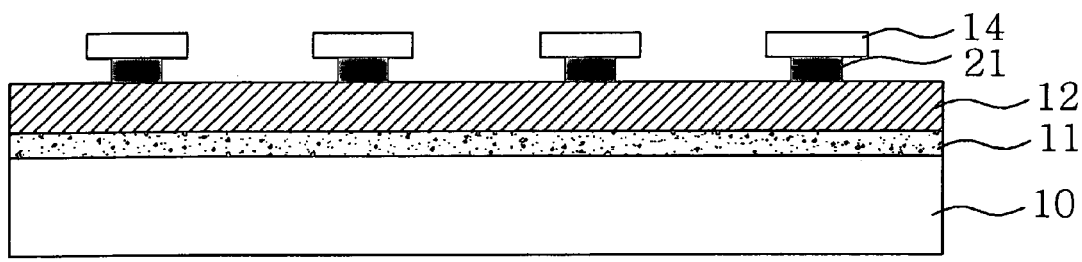
FIG. 2 is a cross-sectional view illustrating a feature after removing a photoresist.

Referring to FIG. 2, the hard mask 13 is etched by plasma to form a hard mask pattern 21. Here, the photoresist pattern 14 is used as an etching mask. The plasma etching is isotropic etching and performed using $SF_6$ gas. After the formation of the hard mask pattern 21, an ashing/strip process is performed to remove the photoresist 14. In forming the hard mask pattern 21, by controlling etching so that the hard mask pattern 21 has a narrower width than that of the photoresist pattern 14, a very fine hard mask pattern 21 can be formed.

Figure 3:
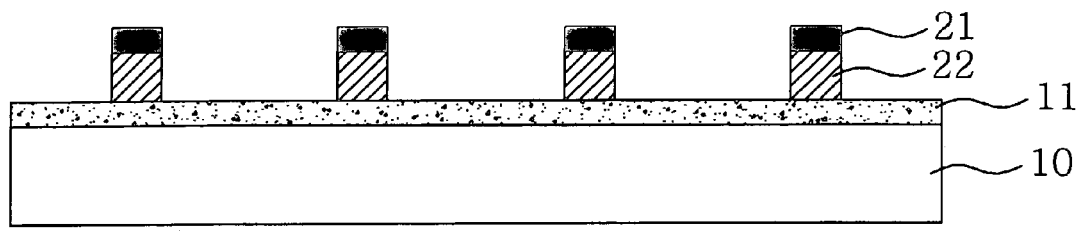
FIG. 3 is a cross-sectional view illustrating a feature after etching a polysilicon layer using a pattern embodied by a hard mask.

Referring to FIG. 3, after the ashing/strip process the gate polysilicon layer 12 is etched by plasma etching to form a gate electrode 22 having the desired CD. Here, the hard mask pattern 21 is used as an etching mask. The plasma etching uses $Cl_2/HBr$, $Cl_2/O_2$, or $HBr/O_2$ as an etching gas. Here, the selectivity of the polysilicon layer 12 to the oxide layer 11 can be about 10 to 1. The resulting gate electrode 22 has a width of about 80 nm, which is smaller than a width of about 120 nm obtained from a KrF light source in a conventional art. A polymer, formed as a residual product resulting from etching the polysilicon layer 12, is removed by using a diluted HF cleaning process.

Figure 4:
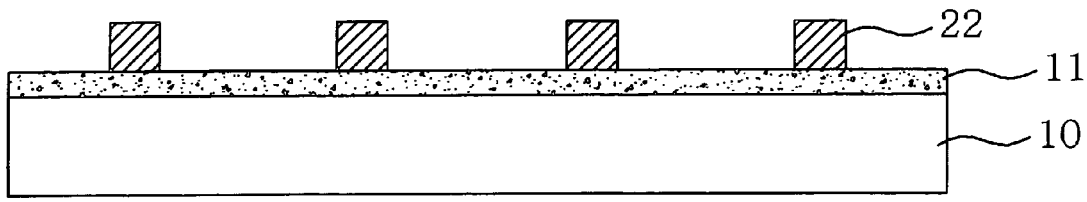
FIG. 4 is a cross-sectional view illustrating a feature after etching the hard mask.

Referring to FIG. 4, the hard mask 21 positioned on the polysilicon gate electrode 22, is selectively removed by using a HF gas, whereas the polysilicon gate electrode 22 and the gate oxide 11 are protected from etching by the hard mask 21. The HF gas is generated by gasifying a solution of about 39% HF. The substrate 10 is put on a hot plate and etched by the HF gas. In etching by the HF gas, the thermal oxide used as the gate oxide 11 is etched with an etching rate less than 1 Å/min. The oxide layer of $SiH_4$, which is formed by PE-CVD and used as the hard mask layer 21, is etched with an etching rate more than about 200 Å/min. The polysilicon 22 is etched with etching rate less than about 1 Å/min. The temperature of the hot plate can be about 50~90° C. The HF gas is generated by spraying $N_2$ gas, at a temperature of more than about 200° C., onto the surface of a chemical bath containing the solution of about 39% HF.

Figure 5:
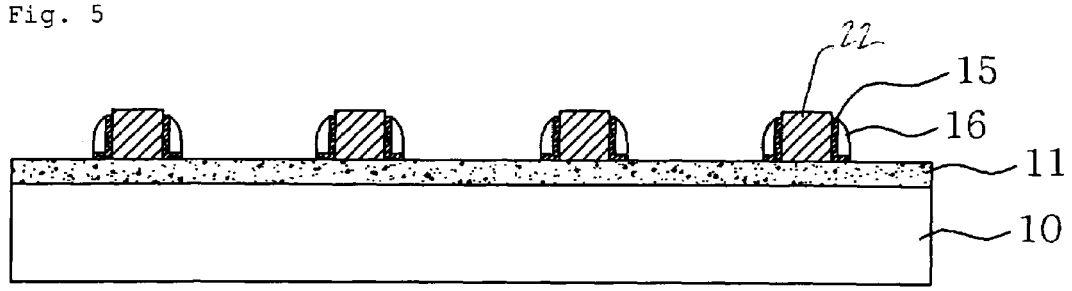
FIG. 5 is a cross-sectional view illustrating a feature after forming a gate electrode with a spacer on a substrate.

Referring to FIG. 5, after removing the hard mask 21, a spacer 16 is formed using a nitride layer. Then, a silicide is formed using fireproof metals, and, finally, a gate device is completed. In detail, after an oxide layer 15 and a nitride layer 16 are deposited in turn on the oxide layer 11 where the hard mask 21 has been removed, the nitride layer 16 is etched by means of an etch back process to form a spacer 16.

The method of fabricating a submicron semiconductor device according to the present embodiment can make a gate electrode 22 having a linewidth of 90 nm using a hard mask 21 instead of a photoresist mask and an existing KrF light source. In addition, by removing selectively only the hard mask 21 positioned on the polysilicon gate 22 using wet-etch by HF gas, the present embodiment can obviate a problem that, in forming a silicide using a fireproof metal after a formation of a spacer 16, the silicide cannot be formed due to a residual hard mask 21.

Accordingly, the present embodiment can make a gate oxide 22 with a finer linewidth using a hard mask 21 instead of a photoresist mask and existing equipment without additional investments. In addition, the present embodiment can control the linewidth required in each product by using an etching process, and, therefore, has advantages such as expandability of process, extension of generality, and maximization of productivity in the production line.

Moreover, by removing selectively a hard mask 21 positioned on a polysilicon gate electrode 22 using wet-etch by HF gas while protecting the gate electrode 22 and a gate oxide 11, the present embodiment can obviate a disadvantage that a silicide cannot be formed due to a residual hard mask 21, thereby improving working speed of a device.

The foregoing embodiments are merely exemplary and are not to be construed as limiting the present invention. The present teachings can be readily applied to other types of apparatuses. The description of the present embodiments is intended to be illustrative, and not to limit the scope of the claims. Many alternatives, modifications, and variations will be apparent to those skilled in the art.

What is claimed is:

1. A method of fabricating a submicron semiconductor device comprising:
   forming a thermal oxide layer on a substrate;
   forming a polysilicon layer on said thermal oxide layer;
   forming a hard mask on said polysilicon layer, wherein said hard mask is a $SiH_4$ oxide deposited by PE-CVD;
   depositing a photoresist on said hard mask and patterning said photoresist by using a mask;
   etching said hard mask by plasma etching to form a thin hard mask pattern by using the photoresist pattern as an etching mask so that the hard mask pattern can have a narrower width than that of the photoresist pattern;
   etching said polysilicon layer by using the hard mask pattern as an etching mask;
   etching a polymer formed as a residual product resulting from etching said polysilicon layer; and
   selectively removing said hard mask pattern using an etching process while protecting said polysilicon layer and said thermal oxide layer from etching, wherein said etching process is performed by HF gas on a hot plate, said HF is generated gasifying a solution of about 39% HF, as the same time that said gas protects a polysilicon gate and a gate oxide, said HF gas is formed through spraying $N_2$ gas onto the surface of a chemical bath containing HF solution, and said hot plate has a temperature of about 50~90° C.

2. The method according to claim 1, further comprising depositing an ARC on said hard mask so as to lower reflectivity.

3. The method according to claim 1, wherein an etching rate of said etching process is less than about 1 Å/min for said gate oxide and more than about 200 Å/min for said hard mask.

4. The method according to claim 1, wherein said photoresist patterning is performed using a KrF Laser as a light source.

5. The method according to claim 1, wherein said polymer is etched by using a dilute HF cleaning process.

* * * * *